United States Patent
Gleason

(10) Patent No.: US 6,874,226 B2
(45) Date of Patent: Apr. 5, 2005

(54) CIRCUIT BOARD PALLET WITH IMPROVED SECUREMENT PIN

(76) Inventor: James Gleason, 406 S. Yale, Garland, TX (US) 75042

(*) Notice: Subject to any disclaimer, the term of this patent is extended or adjusted under 35 U.S.C. 154(b) by 52 days.

(21) Appl. No.: 10/382,700

(22) Filed: Mar. 6, 2003

(65) Prior Publication Data

US 2004/0172817 A1 Sep. 9, 2004

(51) Int. Cl.[7] .................................................. H05K 3/30
(52) U.S. Cl. .......................... 29/832; 29/825; 29/833; 29/840; 29/739; 29/740; 29/741
(58) Field of Search .................. 29/739, 740, 741, 29/825, 832, 833, 840

(56) References Cited

U.S. PATENT DOCUMENTS

| | | | | |
|---|---|---|---|---|
| 3,641,651 A | * | 2/1972 | Rockwell et al. ............. | 29/701 |
| 5,323,528 A | * | 6/1994 | Baker .......................... | 29/721 |
| 5,459,546 A | | 10/1995 | Penn ........................... | 355/53 |
| 5,713,563 A | | 2/1998 | Chan ........................... | 269/21 |
| 5,964,031 A | | 10/1999 | Smith .......................... | 29/832 |
| 5,970,606 A | | 10/1999 | Buechele ..................... | 29/830 |
| 6,036,784 A | | 3/2000 | Huang et al. ............... | 118/728 |
| 6,093,249 A | | 7/2000 | Curtin ........................ | 118/500 |
| 6,131,895 A | | 10/2000 | Sorel et al. ................ | 269/54.5 |
| 6,164,634 A | | 12/2000 | Farlow ........................ | 269/47 |
| 6,336,628 B1 | | 1/2002 | Briau .......................... | 269/47 |
| 6,374,508 B1 | | 4/2002 | Yudovsky .................... | 33/645 |
| 6,378,857 B1 | | 4/2002 | Taylor ......................... | 269/47 |
| 2001/0033049 A1 | | 10/2001 | Gurulc ........................ | 269/53 |
| 2002/0052146 A1 | | 5/2002 | Custer et al. ............... | 439/625 |

* cited by examiner

*Primary Examiner*—Carl J. Arbes
(74) *Attorney, Agent, or Firm*—Rudolf O. Siegesmund

(57) ABSTRACT

A circuit board pallet with an improved securement pin and component positioning arms is disclosed. The improved pin of the present invention is cylindrical pin with an enlarged head. A countersunk hole is drilled in the bottom of the pallet to accommodate the pin. The pin is inserted into the countersunk hole and secured with a high-temperature epoxy resin. The epoxy holds the pin securely in place and keeps the pin from moving up or down.

The present invention also comprises at least one arm affixed at one end to a swivel joint. The swivel joint allows the arm to rotate about a vertical axis. The upper portion of the swivel joint is hinged such that the arm can rotate about a horizontal axis. The combination of movement about the horizontal and vertical axis allows the arm to be positioned at any point over the pallet.

18 Claims, 3 Drawing Sheets

CIRCUIT BOARD PALLET WITH IMPROVED SECUREMENT PIN

CROSS REFERENCE TO RELATED APPLICATIONS

The present application is related to the subject matter of U.S. patent application Ser. No. 10/383,095, incorporated herein by reference.

FIELD OF THE INVENTION

The present invention is directed to the field of improvements in pallets for securing electronic circuit boards during the manufacturing process.

BACKGROUND OF THE INVENTION

Circuit board manufacturing is well known in the art. Electrical components (i.e. processors, memory, capacitors, diodes, resistors, and the like) are generally added to a blank circuit board to create a board which is later installed in an electrical device such as a computer. The blank circuit board must be held in place during the manufacturing process. This is usually accomplished through the use of a circuit board pallet.

There are many different patents directed towards methods of securing the circuit board to the pallet. The most common method is to use a plurality of pins extending upwardly from the pallet which fit into holes on the circuit board. The pallet typically has adjustment arms that create either a tensile or compressive force between these pins to hold the circuit board in place. The most common method of attaching the pins to the pallet is to drill a hole either partially through the pallet from the top or completely through the pallet and wedge a portion of the pin into the hole. These two pin attachment methods are illustrated in FIGS. 1A and 1B. This configuration leaves a portion of the pin methods are illustrated in FIGS. 1A and 1B. This configuration leaves a portion of the pin protruding from the top surface of the pallet so that the circuit board can be attached to the pallet. If the pin is too high, it will interfere with the various component positioning and soldering devices which pass over the circuit board during the manufacturing process. If the pin is too low, it will not sufficiently hold the circuit board in place. Therefore, the distance the pin protrudes from the pallet is an important consideration in the manufacturing process and as a result, the tolerances for pin height are very tight. Furthermore, this pin height must remain within these tight tolerances throughout thousands of cycles of heating and cooling. If the pin height falls out of the tolerance range, then the pallet must be discarded and replaced with a new pallet.

Once the circuit board has been affixed to the pallet, the components may be added to the circuit board, typically by soldering. In order for the components to be soldered in place, they must be properly positioned over the circuit board using a component support structure. The components must be held in place sufficiently long for the solder process to be completed and for the solder to cool and harden. Once the solder has cooled and hardened, it securely affixes the component to the circuit board and the component support structure may be removed from the components.

The frequent and repetitious soldering and other manufacturing processes subject the pallet to intense heat, often in excess of 550° F. Because the pallet is made from a non-conductive material (i.e. fiberglass) and the pins are metal, the pallet and the pin expand and contract at different rates. The differing rates of contraction and expansion eventually cause the pin to move out of the tolerance range. Therefore, a need exists for a method of installing a pin into a pallet such that it will not fall out of tolerance range after repeated heating and cooling.

Moreover, although there have been a myriad of different devices proposed to position the components in place, the previous solutions to this problem have been bulky, complicated, and/or cumbersome to operate. Virtually all of the previous solutions are specific to a certain type of component and/or a certain configuration of components on the board. The prior art does not contain a device that is adaptable to a plurality of different component types and configurations on the circuit board. Consequently, a need also exists for an apparatus and method for efficiently positioning components over a circuit board during the soldering process that is adaptable to a variety of different components. Furthermore, a need exists for a component positioning apparatus that is robust enough to be adaptable to a plurality of different component sizes, shapes, and configurations on the circuit board.

SUMMARY OF THE INVENTION

The present invention, which meets the needs stated above, is a circuit board pallet with an improved circuit board retention pin and component positioning arms. The improved pin of the present invention is cylindrical in shape with an enlarged head. A countersunk hole is drilled in the bottom of the pallet to accommodate the pin. The pin is inserted into the countersunk hole and secured with a high-temperature epoxy resin. The epoxy holds the pin securely in place and keeps the pin from moving up or down.

The present invention also comprises at least one arm. The arm is affixed at one end to a swivel joint. The swivel joint allows the arm to rotate about a vertical axis. The upper portion of the swivel joint is hinged such that the arm can rotate about a horizontal axis. The combination of movement about the horizontal and vertical axis allows the arm to be positioned at any point over the pallet, and consequently, the circuit board.

In the manufacturing process, the blank circuit board is secured to the pallet using the securement pins. Next, the arm is positioned away from the circuit board and the components are secured to the arm. The arm is then positioned over the circuit board and secured to the anchor. Finally, the components may be soldered to the circuit board. Additional components may be secured to the arm and installed on the circuit board as needed.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2A:
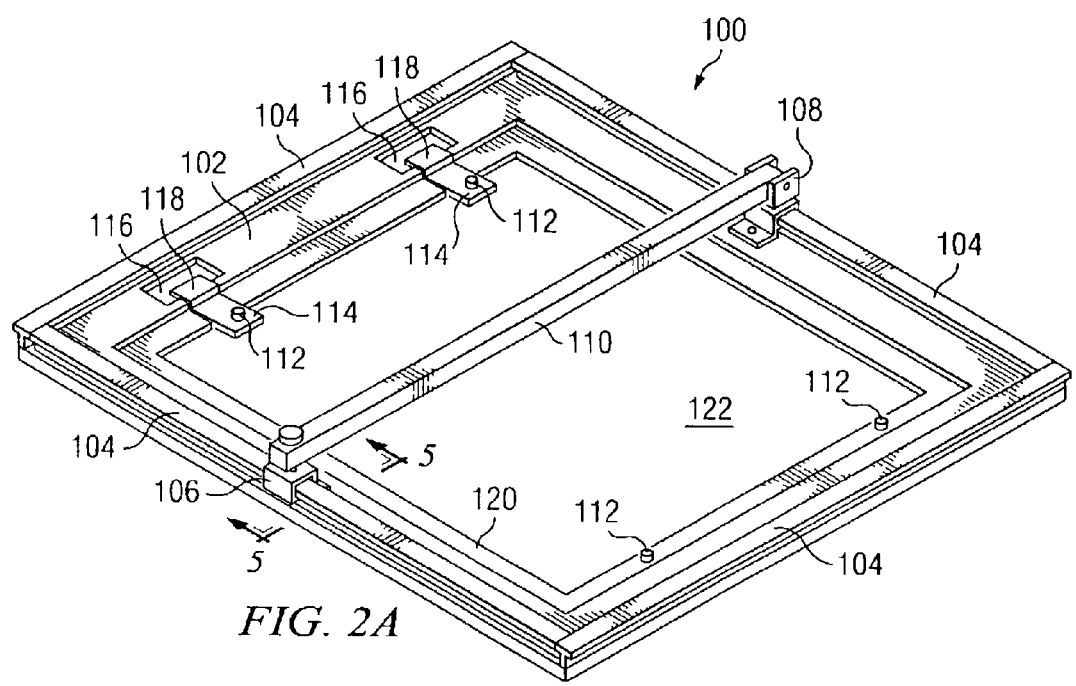
FIG. 2A is a perspective view of the present invention with the arm in the lowered position.

FIG. 2A is a perspective view of pallet 100. The bottom of pallet 100 consists of a flat, rectangular base 102. A circuit board depression 120 in base 102 is sized to accept the circuit board (not shown). Base 102 contains a plurality of pins 112, which are used to secure a circuit board to base 102. Two of the pins 112 in FIG. 2A are attached to adjustable arms 114. The circuit board has holes that accommodate pins 112. The circuit board holes are slightly closer together than the pins 112 in base 102. Thus, when the circuit board is placed in the circuit board depression 120, an operator (not shown) moves adjustment arms 114 inward so that pins 112 will mate up with the holes in the circuit board. The operator can move adjustment arms 114 by pushing tabs 118, which are easily accessed through tab access depression 116. Adjustment arms 114 are spring loaded such that they will create a tensile force on the circuit board when released. After the circuit board has been installed, the operator releases tabs 118 and the tensile force between pins 112 will hold the circuit board in place. Aperture 122 is cut out of base 102 so that the soldering equipment (not shown) can access the bottom of the circuit board.

Four rails 104 are attached to the perimeter of base 102. Rails 104 are "T" shaped when viewed in cross-section. Rails 104 are secured to base 102 with screws inserted up through the bottom of base 102 into rails 104. Swivel joint 108 slides along one of rails 104 and is rotatably attached to the arm 100. Swivel joint 108 is located at the proximate end of arm 110. If desired, a plurality of swivel joints 108 and arms 110 can be employed on pallet 100. The distal end of arm 110 extends across pallet 100 to another rail 104. Arm 110 is secured to rail 104 by anchor 106. Anchor 106 slides along rail 104 similarly to swivel joint 108. If desired, swivel joint 108 and/or anchor 106 may be secured to base 102 using a screw so that they remain in a fixed position with respect to rail 104. Additionally, a plurality of anchors 106 may be utilized for any of the swivel joint 108 and arm 110 combinations.

Figure 2B:
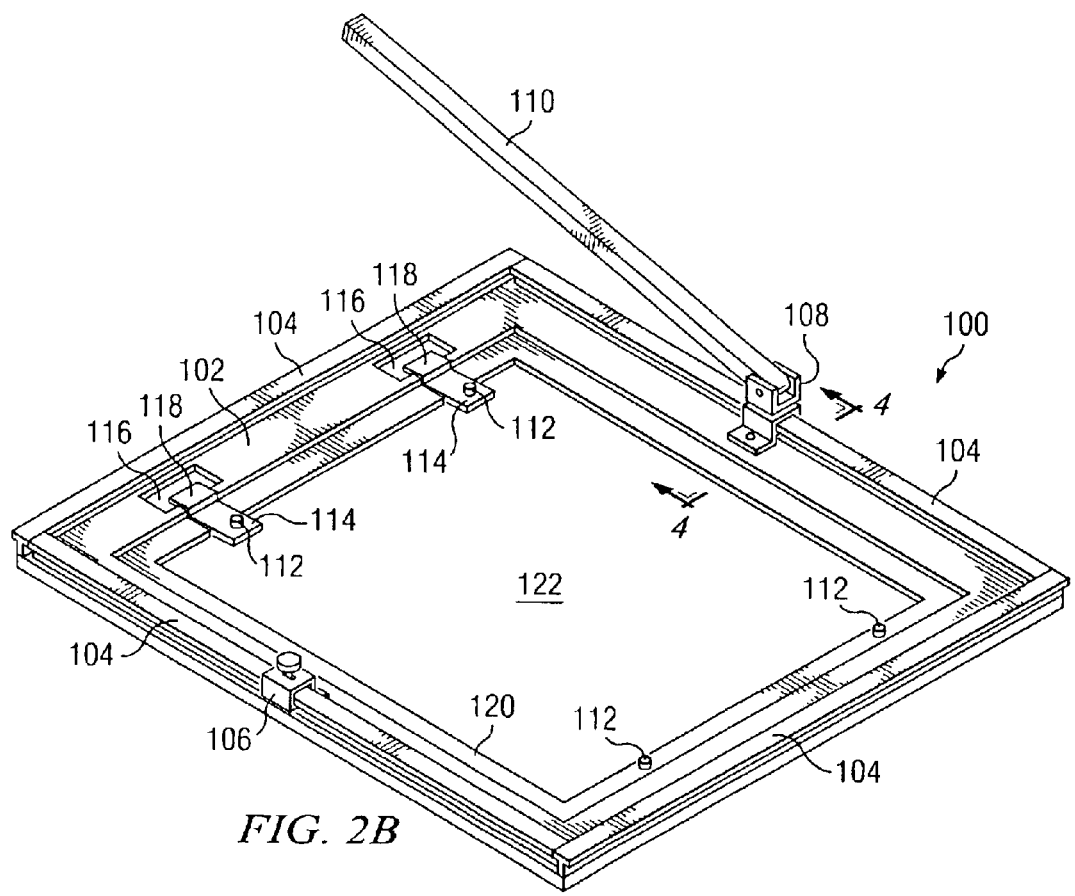
FIG. 2B is a perspective view of the present invention with the arm in the raised position.

FIG. 2B is a perspective view of the present invention with arm 110 detached from anchor 106 and positioned away from base 102. Swivel joint 108 allows arm 110 to be positioned away from base 102 with rotational freedom both parallel and perpendicular to the base 102. In other words, arm 110 has at least a hemisphere of movement. Positioning arm 110 away from base 102 allows an operator (not shown) to attach circuit board components (not shown) to arm 110.

Figure 1A:
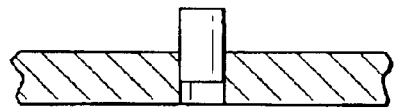
FIGS. 1A and 1B are cross-sectional elevation views of prior art circuit board retention pins.
Figure 1B:
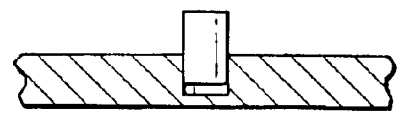
Figure 3A:
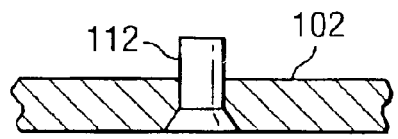
FIGS. 3A and 3B are cross-sectional elevation views of the pin of the present invention.

FIG. 3A is a cross-sectional elevation view of pin 112 and base 102. A high temperature epoxy is used to secure pin 112 inside base 102. The use of a high temperature epoxy to secure pin 112 inside base 102 is much more reliable than the wedging method used in the prior art. Moreover, when pallet 100 is repeatedly heated and cooled in the manufacturing process, the high temperature epoxy will keep pin 112 affixed in place and ensures that pin 112 does not fall outside the narrow tolerance range.

Figure 3B:
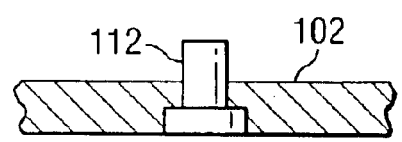

FIG. 3B is an alternative embodiment of pin 112 and base 102. Although FIGS. 3A and 3B illustrate two geometrical embodiments of the present invention, they are not meant to be limiting in any way. Persons skilled in the art will be aware of a myriad of different geometrical configurations of pin 112 and base 102. For example, the shank of pin 112 that is unexposed may be threaded to engage opposing threads in base 102. In other words, pin 112 could partially screw into base 102 in addition to being held in place with the high temperature epoxy. Furthermore, if a more secure connection between pin 112 and base 102 is desired, the bottom of pin 112 can be recessed with respect to the bottom surface of base 102. In this configuration, the high temperature epoxy can be added over the bottom surface of pin 112 creating an even more secure connection between pin 112 and base 102.

Figure 4:
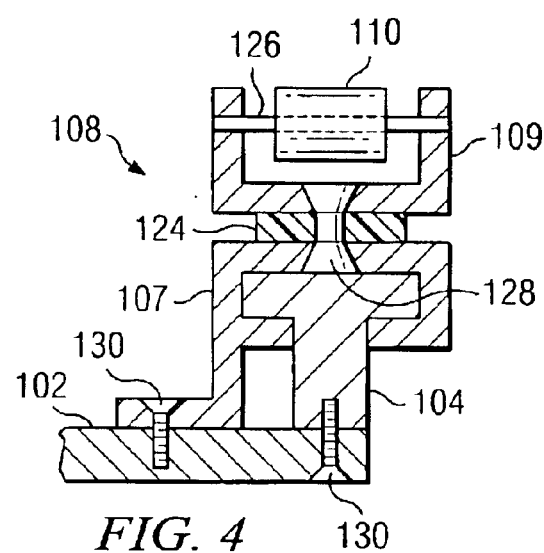
FIG. 4 is a cross-sectional elevation view of the rail and swivel joint of the present invention taken along line 4—4 in FIG. 2B.

FIG. 4 is a detailed illustration of the connection between swivel joint 108, rail 104, and base 102. Rail 104 is affixed to base 102 by a plurality of screws 130. Screws 130 are inserted from underneath base 102 and are threaded into rail 104. Threaded screws 130 are not the only method for affixing rail 104 to base 102 and other methods of attachment are known by persons skilled in the art.

Swivel joint 108 comprises upper member 109 and lower member 107. Lower member 107 comprises two sections: one that is "C" shaped to accommodate "T" shaped rail 104, and another that is "L" shaped, the lower part of which is flush with base 102. The "C" shaped portion of lower member 107 freely slides laterally along rail 104. The "L" shaped portion of lower member 107 has a hole to accommodate a screw 130 which may be screwed into base 102. Screw 130 inserted through lower member 107 into base 102 secures lower member 107 in place and prevents swivel joint 108 from traveling laterally along rail 104.

Swivel joint 128 connects lower member 107 to upper member 109. Washer 124 is disposed between the lower member 107 and upper member 109 to reduce the friction associated with rotation of upper member 109 with respect to lower member 107. Alternatively, washer 124 could be a bearing or any other friction reducing item as determined by persons skilled in the art.

Upper member 109 is "C" shaped in cross-section. Upper member 109 freely rotates about swivel joint pin 128 and has 360° of movement in a plane parallel to base 102. Arm pin 126 runs through arm 110 and the two prongs of upper member 109. In FIG. 4, arm 110 is positioned away from the viewer (going into the page), parallel to rail 104. Arm 110 freely rotates about arm pin 126 and has at least 180° of movement in a plane perpendicular to base 102. In other words, arm 110 in FIG. 4 is hinged about arm pin 126 such that arm 110 can be repositioned to come out of the page instead of going into the page.

Swivel joint 108 is novel in that it allows arm 110 to be positioned away from pallet 100 to receive components, and then positioned over pallet 100 to attach the components to the circuit board. When a plurality of arms 110 are utilized, some of arms 110 can be positioned away from the circuit board so that they may receive the components. Simultaneously, other arms 110 can be positioned over the circuit board so that the components can be soldered to the circuit board.

Figure 5:
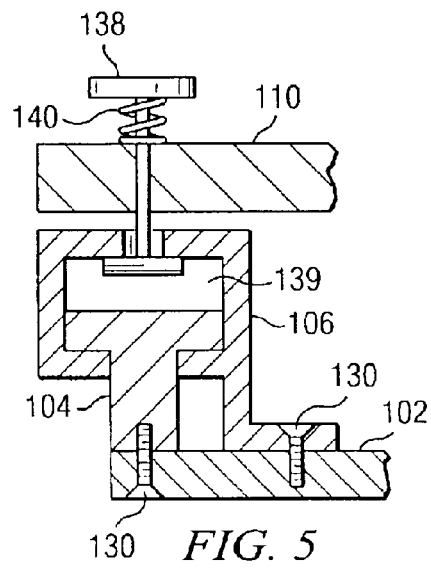
FIG. 5 is a cross-sectional elevation view of the anchor assembly of the present invention taken along line 5—5 in FIG. 2A.

FIG. 5 is a detailed illustration of the connection between anchor 106 and arm 110. Connector 138 is disposed at the distal end of arm 110 in relation to swivel joint 108. Connector 138 comprises a cylindrical center shaft and a shorter cylindrical member perpendicularly attached to each end of the center shaft of connector 138. Connector 138 freely rotates 360° within arm 110. Spring 140 is disposed between arm 110 and connector 138 such that the spring force is always attempting to bring the lower portion of connector 138 in contact with the lower face of arm 110.

Figure 6:
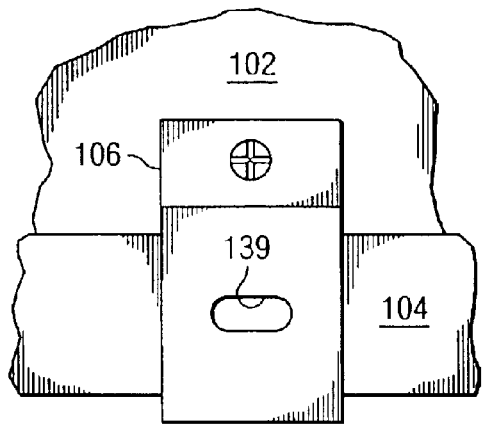
FIG. 6 is a plan view of the anchor assembly of the present invention.

Similarly to lower member 107 in FIG. 4, anchor 106 has a "C" shaped portion and an "L" shaped portion. The "L" shaped portion of anchor 106 can be secured to base 102 with screw 130, similar to lower member 107. The "C" shaped portion of anchor 106 slides along rail 104 similar to lower member 107. However, the inside surface of the "C" shaped portion of anchor 106 does not contact the upper surface of rail 104. Instead, an anchor aperture 139 is created. Anchor aperture 139 is defined as the cavity between anchor 106 and rail 104. As seen in FIG. 6, anchor aperture 139 has an elongated opening on the upper portion of anchor 106. When arm 110 is positioned over anchor 106, connector 138 can be vertically displaced downward and the lower portion of connector 138 will pass through the elongated slot of anchor aperture 139. If connector 138 is then rotated 90° and released, spring 140 will cause the lower portion of connector 138 to come into contact with the inside face of anchor 106 and the lower face of arm 110 will come into contact with the upper face of anchor 106. In this manner, arm 110 can be secured to anchor 106.

Figure 7:
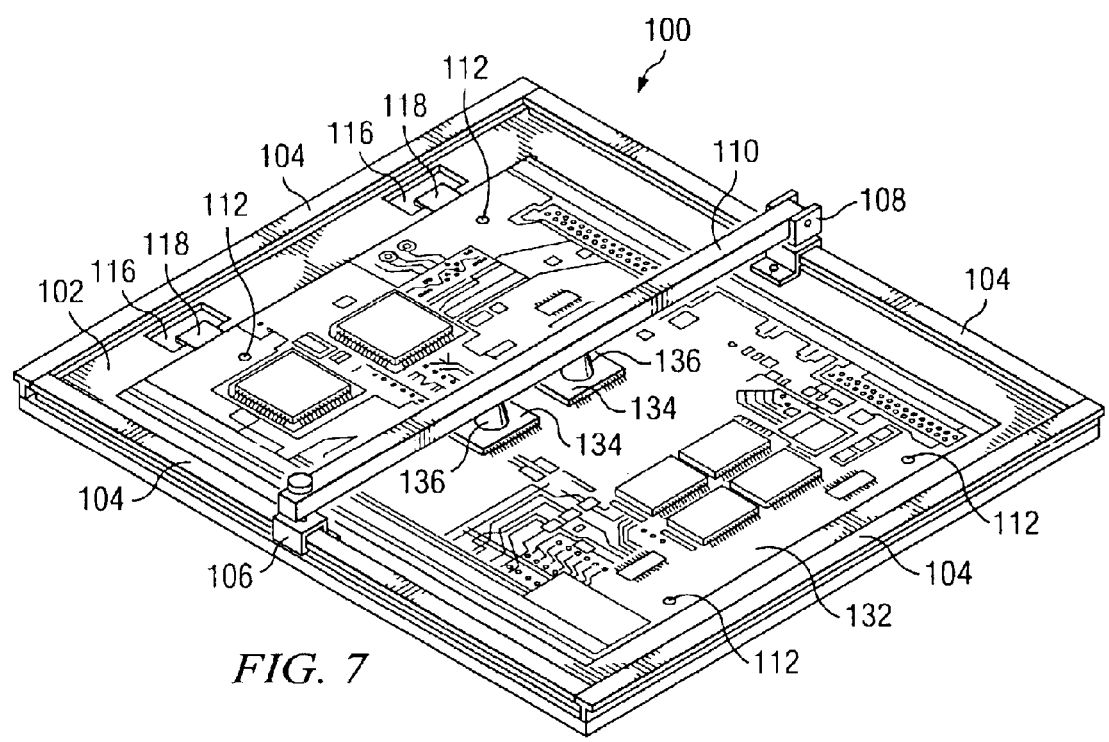
FIG. 7 is a perspective view of a circuit board and the present invention with components attached to the arm.

FIG. 7 is an illustration of circuit board 132 installed in pallet 100. Components 134 have been attached to arm 110 via component holders 136. Arm 110 holds components 134 in place over circuit board 132 while a soldering machine (not shown) solders component 134 into place on circuit board 132. In alternative embodiments, arm 110 is connected to anchor 106 at both the proximate and the distal end. This embodiment yields an arm 110 that is fully detachable from the pallet 100. In further alternative embodiments, a plurality of arm 110 and swivel joint 108 combinations are used to attach components 134 to circuit board 132.

With respect to the above description, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. The novel spirit of the present invention is still embodied by reordering or deleting some of the steps contained in this disclosure. The spirit of the invention is not meant to be limited in any way except by proper construction of the following claims.

What is claimed is:

1. An apparatus for attaching a plurality of components to a circuit board comprising:

a base;

an adjustment arm disposed within said base;

a plurality of pins extending upwardly from said base, at least one of said pins disposed on said adjustment arm;

wherein said adjustment arm is used to secure a circuit board onto said base;

wherein at least part of the unexposed portion of said pins is larger in diameter than the exposed portion of said pins;

wherein said pin is positioned in a hole in said base; and wherein a high temperature epoxy secures said pin in said base.

2. The apparatus of claim 1 further comprising:

a swivel joint affixed to said base;

an arm rotatably attached to said swivel joint;

wherein said swivel joint allows said arm to rotate 360° is a plane parallel to said base; and wherein said swivel joint allows said arm to rotate approximately 180° in a plane perpendicular to said base.

3. The apparatus of claim 2 wherein said swivel joint comprises:

a lower member attached to said base;

a swivel joint pin extending upwardly from said lower member;

an upper member connected to said lower member by said swivel joint pin; and wherein said arm is rotatably attached to said upper member.

4. The apparatus of claim 3 further comprising:

a rail affixed to the top of said base;

wherein said swivel joint slides along said rail.

5. The apparatus of claim 4 wherein said rails are "T" shaped in cross-section.

6. The apparatus of claim 2 further comprising:

an anchor affixed to said base; and wherein said arm is removably attachable to said anchor.

7. The apparatus of claim 6 further comprising:

a rail attached to said base; and wherein said anchor slides along said rail.

8. The apparatus of claim 7 wherein said anchor comprises:

an anchor aperture; and wherein said anchor aperture is sized to receive a connector disposed at the distal end of said arm in relation to said swivel joint.

9. The apparatus of claim 1 further comprising:

a component holder affixed to said arm; and wherein said component holder holds a component over a circuit board during a soldering process.

10. A method of attaching a component to a circuit board comprising:

positioning an adjustment arm in a base to align a plurality of pins extending upwardly from said base with holes in a circuit board, at least one of said pins disposed on said adjustment arm;

wherein the diameter of said pins is larger at the bottom of said pins than at the top of said pins;

wherein said pin is positioned in a hole in said base; and wherein a high temperature epoxy secures said pin in said base.

11. The method of claim 10 further comprising:

positioning an arm affixed to a base away from said base;

affixing a component to said arm;

repositioning said arm over said circuit board;

soldering said component to said circuit board;

wherein a swivel joint allows said arm to be positioned over said circuit board and away from said circuit board;

wherein said swivel joint allows said arm to rotate 360° C. is a plane parallel to said base; and wherein said swivel joint allows said arm to rotate approximately 180° in a plane perpendicular to said base.

12. The method of claim 11 wherein said swivel joint comprises:

a lower member attached to said base;

a swivel joint pin extending upwardly from said lower member;

an upper member connected to said lower member by said swivel joint pin; and wherein said arm is rotatably attached to said upper member.

13. The method of claim 12 wherein said base comprises:

a rail affixed to the top of said base;

wherein said swivel joint slides along said rail.

14. The method of claim 13 wherein said rails are "T" shaped in cross-section.

15. The method of claim 11 further comprising:

attaching said arm to an anchor affixed to said base; and wherein said arm is removably attached to said anchor.

16. The method of claim 15 further comprising:

a rail attached to said base; and wherein said anchor slides along said rail.

17. The method of claim 16 wherein said anchor comprises:

an anchor aperture; and wherein said anchor aperture is sized to receive a connected disposed at the distal end of said arm in relation to said swivel joint.

18. The method of claim 10 further comprising:

attaching a component to a component holder affixed to said arm; and wherein said component holder positions a component over a circuit board during a soldering process.

* * * * *

UNITED STATES PATENT AND TRADEMARK OFFICE
CERTIFICATE OF CORRECTION

PATENT NO. : 6,874,226 B2
DATED : April 5, 2005
INVENTOR(S) : Gleason

It is certified that error appears in the above-identified patent and that said Letters Patent is hereby corrected as shown below:

Column 4,
Line 36, "joint 128" should be -- joint pin 128 --

Signed and Sealed this

Nineteenth Day of July, 2005

JON W. DUDAS
*Director of the United States Patent and Trademark Office*